(12) United States Patent
Chen et al.

(10) Patent No.: US 7,838,851 B2
(45) Date of Patent: Nov. 23, 2010

(54) METHOD AND DEVICE FOR FABRICATING NANO-STRUCTURE WITH PATTERNED PARTICLE BEAM

(75) Inventors: Jyh-Shin Chen, Hsin-Chu (TW); Liang-Chiun Chao, Taipei (TW); Sheng-Yuan Chen, Hsin-Chu (TW); Hsiao-Yu Chou, Hsin-Chu (TW)

(73) Assignee: Instrument Technology Research Center, National Applied Research Laboratories, Hsin-Chu (TW)

( * ) Notice: Subject to any disclaimer, the term of this patent is extended or adjusted under 35 U.S.C. 154(b) by 764 days.

(21) Appl. No.: 11/767,816

(22) Filed: Jun. 25, 2007

(65) Prior Publication Data

US 2008/0020301 A1 Jan. 24, 2008

(30) Foreign Application Priority Data

Jul. 18, 2006 (TW) .............................. 95126302 A

(51) Int. Cl.
*G21K 5/04* (2006.01)

(52) U.S. Cl. .............................. 250/492.23; 250/492.1; 977/701; 977/840; 977/849; 977/859; 977/901; 438/674

(58) Field of Classification Search .............. 250/492.1, 250/492.2, 492.21, 492.23, 492.24, 492.3, 250/491.1, 492.22; 977/700, 701, 742, 762, 977/840, 843, 844, 849, 850, 859, 890, 891, 977/901; 438/676, 674
See application file for complete search history.

(56) References Cited

U.S. PATENT DOCUMENTS

| | | | | |
|---|---|---|---|---|
| 4,904,866 A * | 2/1990 | Collins et al. | ............ | 250/492.2 |
| 6,437,852 B1 * | 8/2002 | Sugita | .......................... | 355/53 |
| 6,660,959 B2 * | 12/2003 | Vallance et al. | ........ | 219/121.18 |
| 6,963,077 B2 * | 11/2005 | DeHon et al. | .................. | 257/9 |
| 6,998,358 B2 * | 2/2006 | French et al. | ............... | 438/800 |
| 7,153,615 B2 * | 12/2006 | Bristol et al. | .................. | 430/5 |
| 7,304,719 B2 * | 12/2007 | Albert et al. | .................. | 355/71 |
| 7,410,901 B2 * | 8/2008 | Pilchowski | ................. | 438/689 |
| 2007/0111250 A1 * | 5/2007 | Takada | .......................... | 435/6 |
| 2007/0137555 A1 * | 6/2007 | Yang | .......................... | 117/54 |
| 2007/0161238 A1 * | 7/2007 | Lin | .......................... | 438/674 |
| 2009/0214851 A1 * | 8/2009 | Corderman et al. | ...... | 428/315.9 |

* cited by examiner

*Primary Examiner*—Jack I Berman
*Assistant Examiner*—Nicole Ippolito Rausch
(74) *Attorney, Agent, or Firm*—Volpe and Koenig P.C.

(57) ABSTRACT

The present invention provides a method and an apparatus for producing a two-dimensional patterned beam, e.g. a two-dimensional patterned and focused ion beam, for fabricating a nano-structure on a substrate with the precursor gas. In comparison with the conventional focused ion beam that is applied for fabricating a dot-like nano-structure the method is more simplified and easy to be achieved.

22 Claims, 7 Drawing Sheets

METHOD AND DEVICE FOR FABRICATING NANO-STRUCTURE WITH PATTERNED PARTICLE BEAM

FIELD OF THE INVENTION

The present invention relates to an apparatus for fabricating a nano-structure and the method therefor. More particularly, the present invention relates to an apparatus for fabricating a two-dimensional nano-structure and the method therefor.

BACKGROUND OF THE INVENTION

In the existing semiconductor process, the desired dot-like nano-structure is typically fabricated by means of the dot-like particle source, such as the laser beam, the electron beam and the ion beam, in combination with the deposition and reaction of a precursor gas.

The lithography process has been well-developed for the formation of two-dimensional nano-structure, and by means of which a designed and desired two-dimensional wiring pattern could be completely and accurately copied onto a substrate or wafer. The designed pattern needs to be fabricated onto a photo mask, and is then projected to the substrate or wafer by means of optical imaging, where only the lights, emitting from the dot-like source, through the transparent area of the photo mask could be transmitted through the lens and imaged on the surface of the substrate or wafer. In addition, it is also applicable to apply a photosensitive material onto the substrate, so that the desired pattern could be formed thereon by being exposed to a focused ion beam (FIB).

The achievable resolution, i.e. the line width, of the electron beam or ion beam is approximately 15 nm, and hence the electron beam or ion beam possesses a technical potential in producing the nano-structure of a decreased size. Nevertheless, it is known that a great amount of heat would be generated while the focused electron beam or ion beam passes through the photo mask, resulting in a distortion of the image, and accordingly the characteristics of the fabricated nano-structure would be seriously damaged. While applying the focused electron beam or ion beam in the fabrication of two-dimensional nano-structure, in this case, it needs to precisely control the move of the FIB to correspond to the substrate, which is moved in the x-direction and in the y-direction, so that the precursor gas would react therewith and thereby the desired two-dimensional nano-structure is formable on a desired position on the substrate. Such technique is disadvantageous in not only the difficulty in the precise control for the FIB but a relatively long period of fabrication, and thus has a limited application and development so far.

On the other hand, the well-developed lithography process makes it achievable to fabricate the desired two-dimensional patterns on large scale. Nevertheless, the application of such a process is still limited since the achievable resolution thereof is uncompetitive, e.g. the line width is up to 90 nm.

For overcoming the mentioned drawbacks existing in the conventional techniques, a novel method and device for fabricating the nano-structure with a patterned particle beam is provided in the present invention, where the desired two-dimensional nano-structure is directly fabricated with a generated patterned focused ion beam. In comparison with the existing technique, the fabrication according to the present invention is more simplified and applicable.

SUMMARY OF THE INVENTION

It is a first aspect of the present invention to provide a fabrication method for producing a nano-structure with a patterned particle beam. The method includes steps of providing a particle beam, patterning the particle beam into a two-dimensional patterned particle beam, exposing a substrate under the two-dimensional patterned particle beam, and providing a precursor gas to react with the two-dimensional patterned particle beam, whereby the nano-structure is formed on the substrate.

In accordance with the mentioned aspect, the particle beam is selected from a group consisting of a photon beam, an electron beam, an ion beam and the combination thereof.

Preferably, the photo beam is generated from one selected from a group consisting of a laser, a mercury lamp, an ultra-violet light source and the combination thereof.

Preferably, the photo beam is divided into two beams for forming the two-dimensional patterned particle beam by means of one of interference and diffraction.

Preferably, the electron beam is generated from one selected from a group consisting of a field emission source, a thermal emission source, a thermal field emission source, an electron cyclotron, a photocathode, a cesium target and the combination thereof, and the two-dimensional patterned particle beam is formed by the electron beam passing through one of a mask and a reticle.

Preferably, the ion beam is generated from one selected from a group consisting of a plasma, a liquid metal ion source and a gas field ion source, and the two-dimensional patterned particle beam is formed by the ion beam passing through one of a mask and a reticle.

Preferably, the precursor gas absorbs an energy provided by the two-dimensional patterned particle beam and is decomposed to produce the nano-structure on the substrate.

It is a second aspect of the present invention to provide a fabrication method for producing a two-dimensional nano-structure. The method includes steps of providing a two-dimensional patterned particle beam, exposing a substrate to the two-dimensional patterned particle beam, and providing a precursor gas reacting with the two-dimensional patterned particle beam, whereby a nano-structure being formed on the substrate.

In accordance with the mentioned aspect, the particle beam is selected from a group consisting of a photon beam, an electron beam, an ion beam and the combination thereof.

It is a third aspect of the present invention to provide a fabrication apparatus for producing a patterned particle beam. The apparatus includes a particle source providing a particle beam, and a patterning device configured for patterning the particle beam so as to generate the patterned particle beam.

In accordance with the mentioned aspect, the patterning device includes a structure of plural wires and a sleeve covering the structure of plural wires, wherein the structure of plural wires has a lengthwise direction parallel to that of the sleeve.

Preferably, the particle source is one selected from a group consisting of a laser, a field emission source, a thermal emission source, a thermal field emission source, a plasma, a liquid metal ion source and a gas field ion source.

Preferably, the structure of wires is made of tungsten.

Preferably, the sleeve is made of one selected from a group consisting of tantalum, molybdenum and tungsten.

Preferably, the patterning device is an optical fiber.

Preferably, the structure of wires and the sleeve are made of an oxide, and more preferably the oxide is a silicon oxide.

Preferably, the patterning device is made by means of lithography and etching.

It is a fourth aspect of the present invention to provide a fabrication apparatus for producing a patterned particle beam. The apparatus includes a particle source providing a particle beam, and a patterning device having a pillar-shaped structure and a pattern cover disposed on a surface above the pillar-shaped structure.

In accordance with the mentioned aspect, the particle beam passes through the pattern cover and thereby the patterned particle beam is produced.

Preferably, the pillar-shaped structure is made of stainless steel, and the pattern cover is made of nickel alloy.

It is a fifth aspect of the present invention to provide a fabrication apparatus for producing a nano-structure with a patterned particle beam. The apparatus includes a patterned particle source providing a patterned particle beam, a gas source providing a precursor gas, and a holder carrying and moving a substrate disposed thereon.

In accordance with the mentioned aspect, the nano-structure is formed on the substrate by the patterned particle beam reacting with the precursor gas.

In accordance with the mentioned aspect, the patterned particle source includes a particle source providing a particle beam and a patterning device configured for patterning the particle beam so as to form the patterned particle beam.

Preferably, the particle source is one selected from a group consisting of a laser, a mercury lamp, an ultraviolet light source, a field emission source, a thermal emission source, a thermal field emission source, a plasma, a liquid metal ion source and a gas field ion source.

The foregoing and other features and advantages of the present invention will be more clearly understood through the following descriptions with reference to the drawings, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

In the present invention, the desired nano-structure is produced by the reaction of the precursor gas provided by a precursor gas source directly with a two-dimensional patterned particle beam, such as a two-dimensional patterned and focused ion beam, rather than the conventional dot-like formation with a dot-like focused ion beam.

Figure 1:
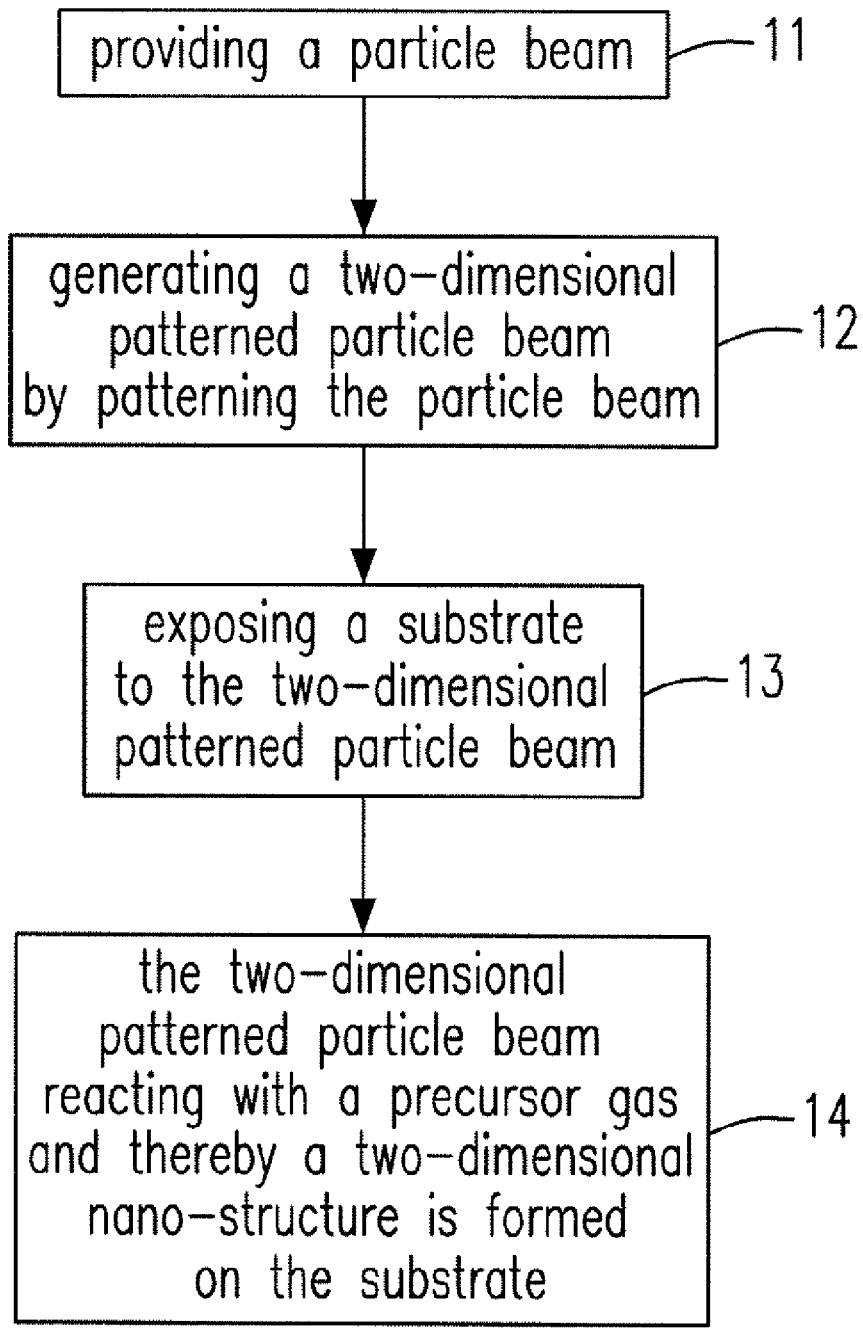
FIG. 1 is a flow chart illustrating the steps of the fabrication method for producing a two-dimensional nano-structure in accordance with a preferred embodiment of the present invention.

With reference to FIG. 1, the steps of the fabrication method for producing a two-dimensional nano-structure in accordance with a preferred embodiment of the present invention are illustrated. First, a particle beam is provided, which may be a light beam generated by a laser, a mercury lamp or an ultraviolet light source, or may be an electron beam, an ion beam or the combination thereof, as shown in the step 11. The particle beam is then patterned so as to form a two-dimensional patterned particle beam, as shown in the step 12, and thereby the patterned particle beam is provided with the desired pattern for the two-dimensional nano-structure to be produced. Afterward, a substrate is provided and exposed to the patterned particle beam, and the precursor gas for the two-dimensional nano-structure to be produced is introduced, so that the two-dimensional patterned particle beam would be decomposed and/or react with the precursor gas, and thereby the desired nano-structure is formed on the substrate, as shown in the steps 13 and 14, respectively. In a preferred embodiment, the precursor gas is heated so as to be provided with a sufficient energy to decompose and directly react with the patterned particle beam.

According to the present invention, the particle beam is patterning by different means, depending on the type thereof. For example, the light beam, generated by a laser, to be patterned is divided into two sub-beams, where the respective light path differences as well as the field patterns thereof are modified to enhance the interference, diffraction, or holographic effect of the two sub-beams, and thereby a two-dimensional patterned light beam is formed. Alternatively, the desired two-dimensional patterned light beam is also directly achievable by means of mask. On the other hand, the two-dimensional patterned electron beam could be generated directly by an array of carbon-nanotube. Alternatively, it is also achievable to generate such two-dimensional patterned electron beam by illuminating a proper target, such as a cesium target, with a two-dimensional ultraviolet light beam, by any further array capable of emitting a two-dimensional electron beam, or by means of using a reticle. If an ion beam is to be adopted in the present invention, the ion beam generated by a liquid metal ion source (LMIS) or a gas field ion source (GFIS) and introduced from a slot-typed nuzzle would be applied with a voltage, so as to form the desired two-dimensional patterned ion beam. Needless to say, the desired two-dimensional patterned ion beam is also formable by the plasma in combination with a proper reticle.

Consequently, the two-dimensional patterned particle beam is adopted in the present invention to directly fabricate the desired two-dimensional nano-structure on the substrate, so as to eliminate the formation fault of the nano-structure that is caused by the difficulty in controlling the conventional particle beam and the substrate for the prior art. Moreover, the time period necessary for forming the desired nano-structure could be also reduced.

Figure 2:
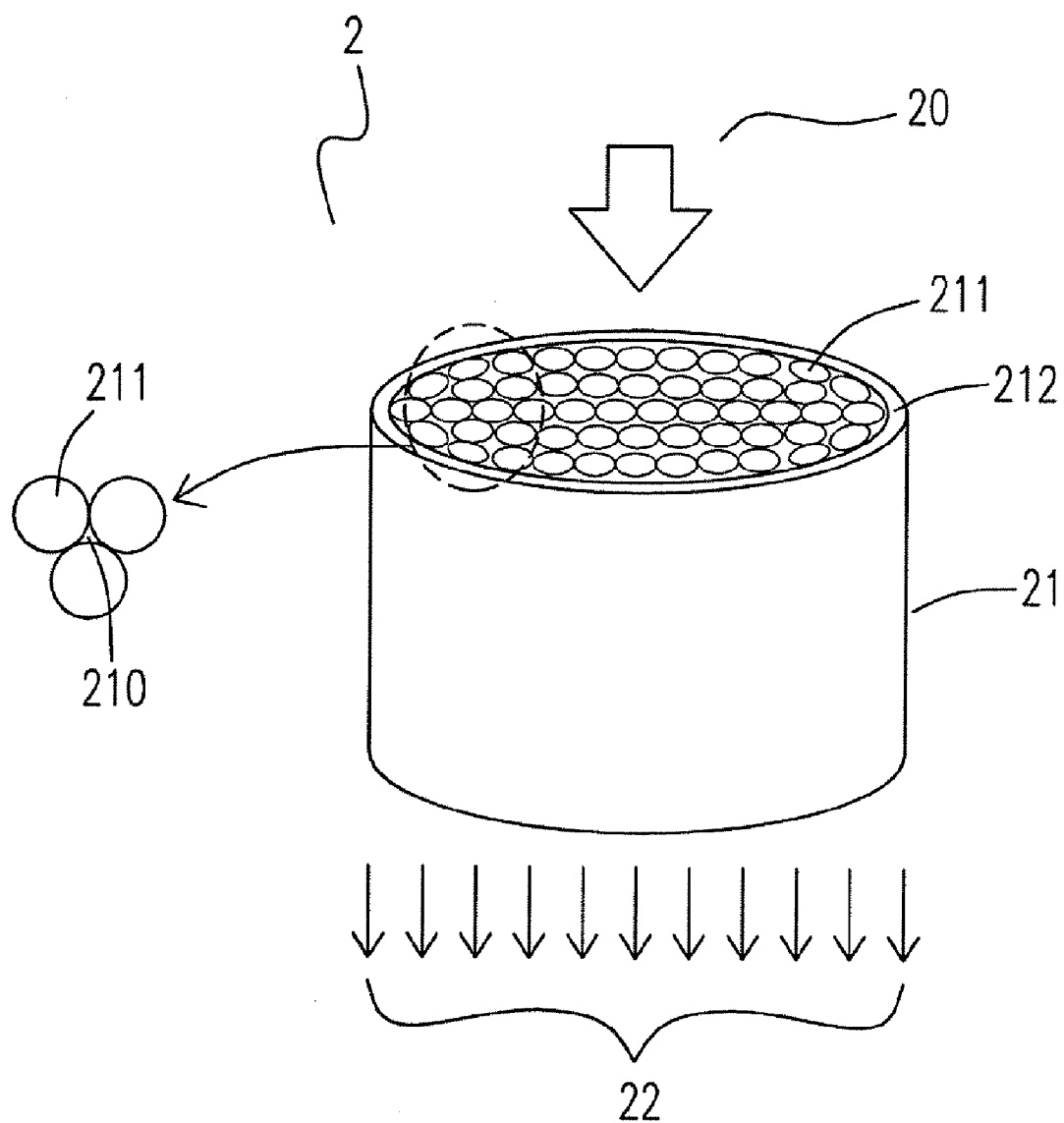
FIG. 2 is a diagram schematically illustrating the fabrication apparatus for producing a two-dimensional nano-structure in accordance with a preferred embodiment of the present invention.

Please refer to FIG. 2, which is a diagram schematically illustrating the fabrication apparatus 2 for producing a two-dimensional nano-structure in accordance with a preferred embodiment of the present invention. In this preferred embodiment, the particle beam 20 generated by a dot-like particle source is passing through a patterning device 21, and thereby the patterned particle beam 22, provided with a desired two-dimensional pattern for the nano-structure, for the two-dimensional nano-structure to be produced is formed. According to the present invention, the dot-like particle source is an electron source that is generated by illuminating a proper film target, such as a cesium target, with the ultraviolet light and applying a proper voltage thereon. Alternatively, a typical LMIS or GFIS is also adoptable in the present invention. In a preferred embodiment, the patterning device 21 is constructed by a structure of plural tungsten wires 211 and a metal sleeve 212 therefor. Preferably, the sleeve 212 is made of heat-resistant metallic material such as tantalum, molybdenum and tungsten. In this embodiment, the precursor gas passes through the vacancies 210 formed among the plural tungsten wires, and further decomposes and/or react with the patterned particle beam 22, whereby the desired two-dimensional nano-structure is formed on the substrate.

Alternatively, the patterning device 21 is constructed by a beehive-structured optical fiber. In more specifics, the patterning device 21 includes plural wires 211 and a sleeve 212 therefor, where the wires 211 and the sleeve 212 are both made of oxides. In this case, the light beam passes through the cross-section of the plural wires 211, and thereby the desired two-dimensional patterned light beam is formed, which is further imaged onto the surface of a substrate or wafer, so as to produce the two-dimensional patterned nano-structure thereon.

Figure 3:
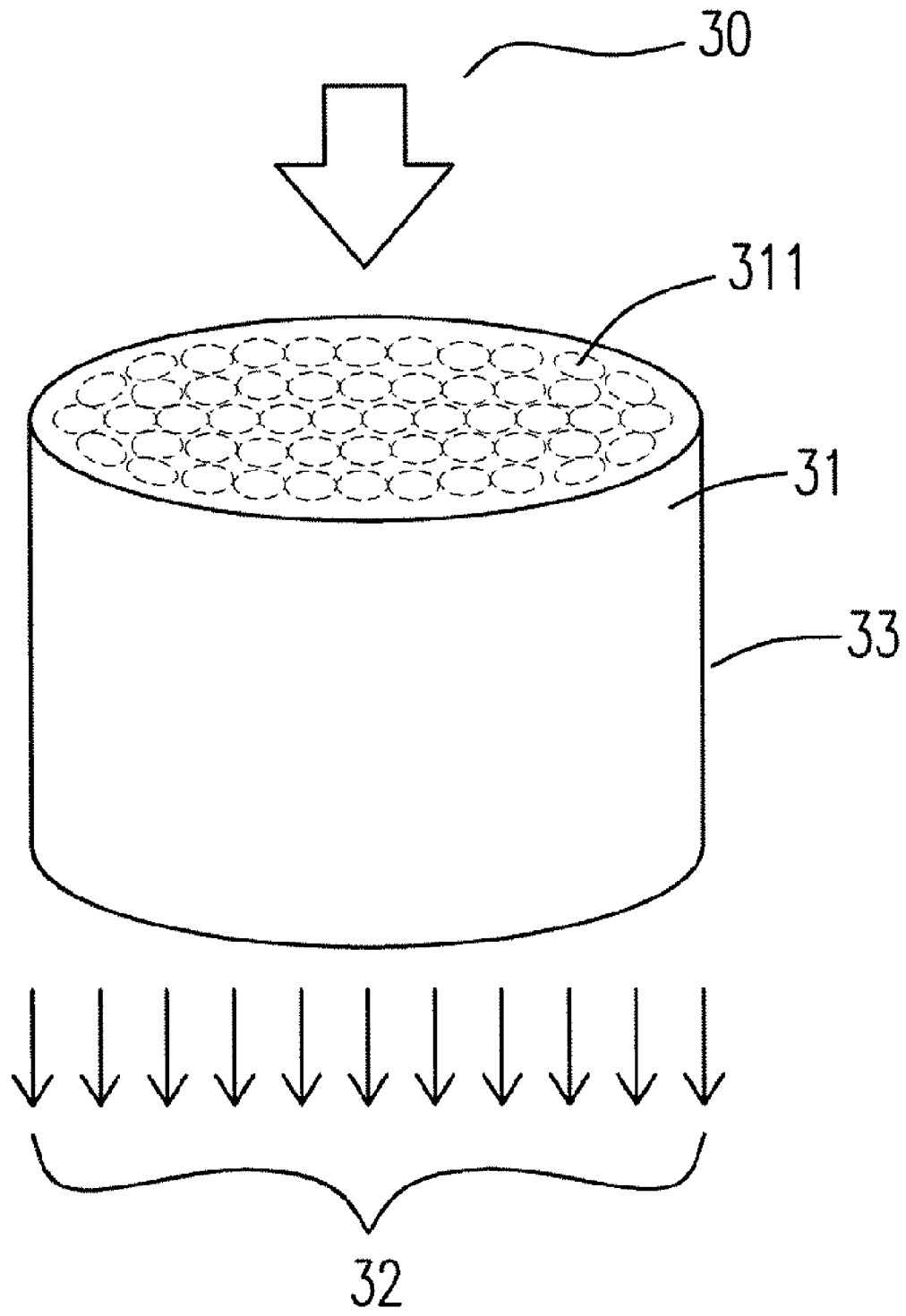
FIG. 3 is a diagram schematically illustrating the fabrication apparatus for producing a two-dimensional nano-structure in accordance with a further preferred embodiment of the present invention.

With reference to FIG. 3, the fabrication apparatus 3 for producing a two-dimensional nano-structure in accordance with a further preferred embodiment of the present invention is schematically illustrated. In this embodiment, the particle beam generated by a dot-like particle source 30 is passing through the patterning device constructed by a pattern cover 31 and a pillar-structure 32, by means of which the patterned particle beam 32 is formed through the pattern 311 designed on the pattern cover 31.

Figure 4:
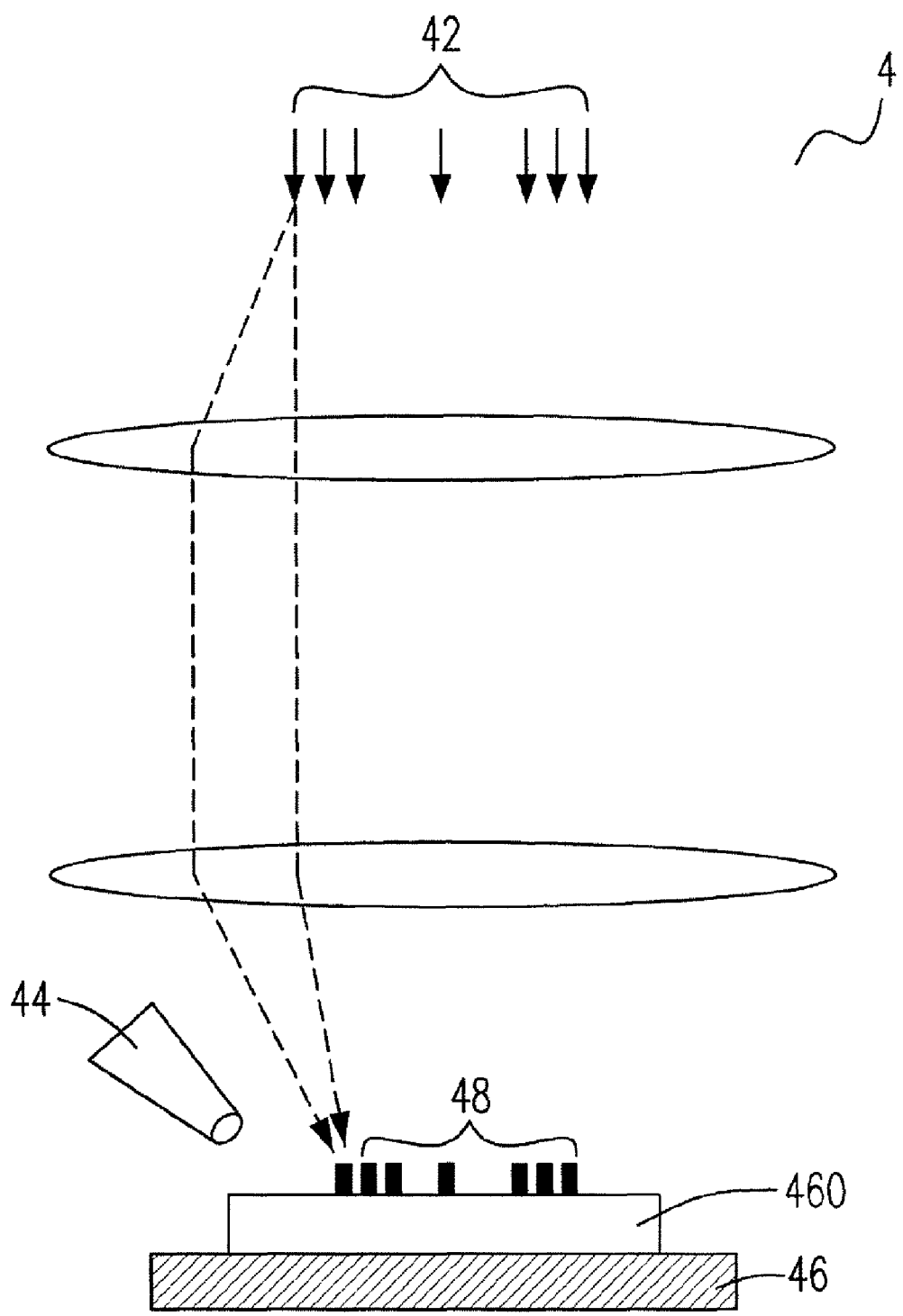
FIG. 4 is a diagram schematically illustrating the fabrication apparatus for producing a nano-structure with a patterned and focused ion beam in accordance with a preferred embodiment of the present invention.

Referring to FIG. 4, which is a diagram schematically illustrating the fabrication apparatus for producing a nano-structure with a patterned and focused ion beam in accordance with a preferred embodiment of the present invention, the apparatus 4 is constructed by a patterned particle source, a precursor gas source 44 and a holder 46. The patterned particle source is adopted to generate a patterned particle beam 42 which would react with the precursor gas that is provided by the precursor gas source 44, and thereby the desired nano-structure 48 is produced on the substrate 460 carried on the holder 46. Certainly, the temperature of the substrate 460 is adjustable for the nano-structure to be produced.

In accordance with the present invention, the patterned particle source is constructed by the particle source and the patterning device as shown in FIG. 2, where the desired patterned particle beam is generated from a particle beam provided by the particle source and patterned by the patterning device.

Figure 5A:
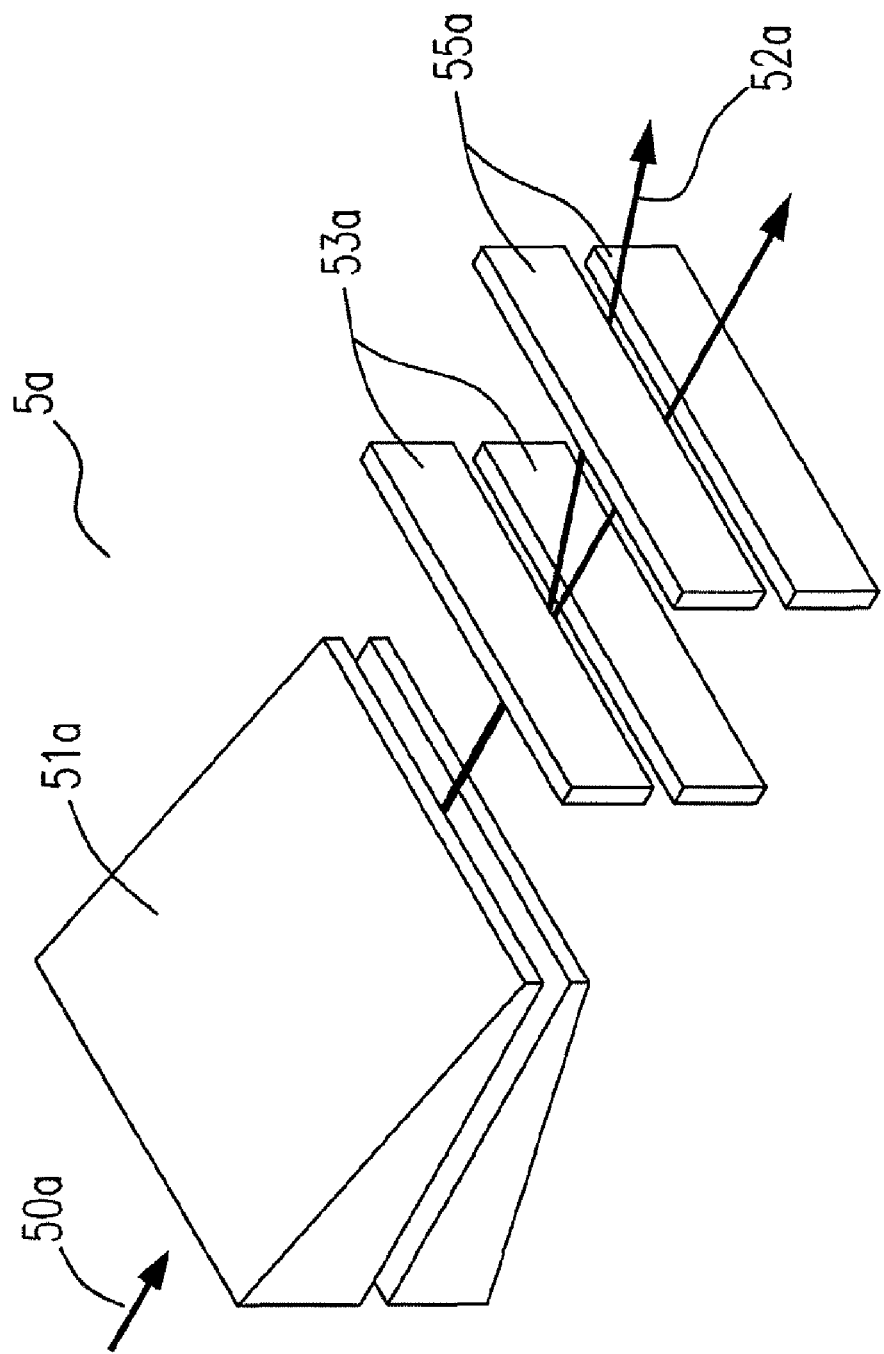
FIG. 5(A) is a diagram schematically illustrating the fabrication apparatus for producing a nano-structure with a two-dimensional patterned electron beam generated by a liquid metal ion source in accordance with a preferred embodiment of the present invention.

With reference to FIG. 5(A), the fabrication apparatus for producing a nano-structure with a two-dimensional patterned electron beam generated by a liquid metal ion source in accordance with a preferred embodiment of the present invention is schematically illustrated. The fabrication apparatus 5a is constructed by a slot-shaped nuzzle 51a and an electrode set of grid 53a and extractor 55a. The liquid metal stream or the gas metal stream, generated by the LMIS or GFIS respectively, is introduced out from the nuzzle 51a, and a proper voltage level is applied thereto to further extract the desired ion beam 50a therefrom. The extracted ion beam 50a is distributed as the desired two-dimensional patterned ion beam 52a through the electrode set of grid 53a and extractor 55a. In one further embodiment, the ion beam 50a and the two-dimensional patterned ion beam 52a could be also generated from the plasma.

Figure 5B:
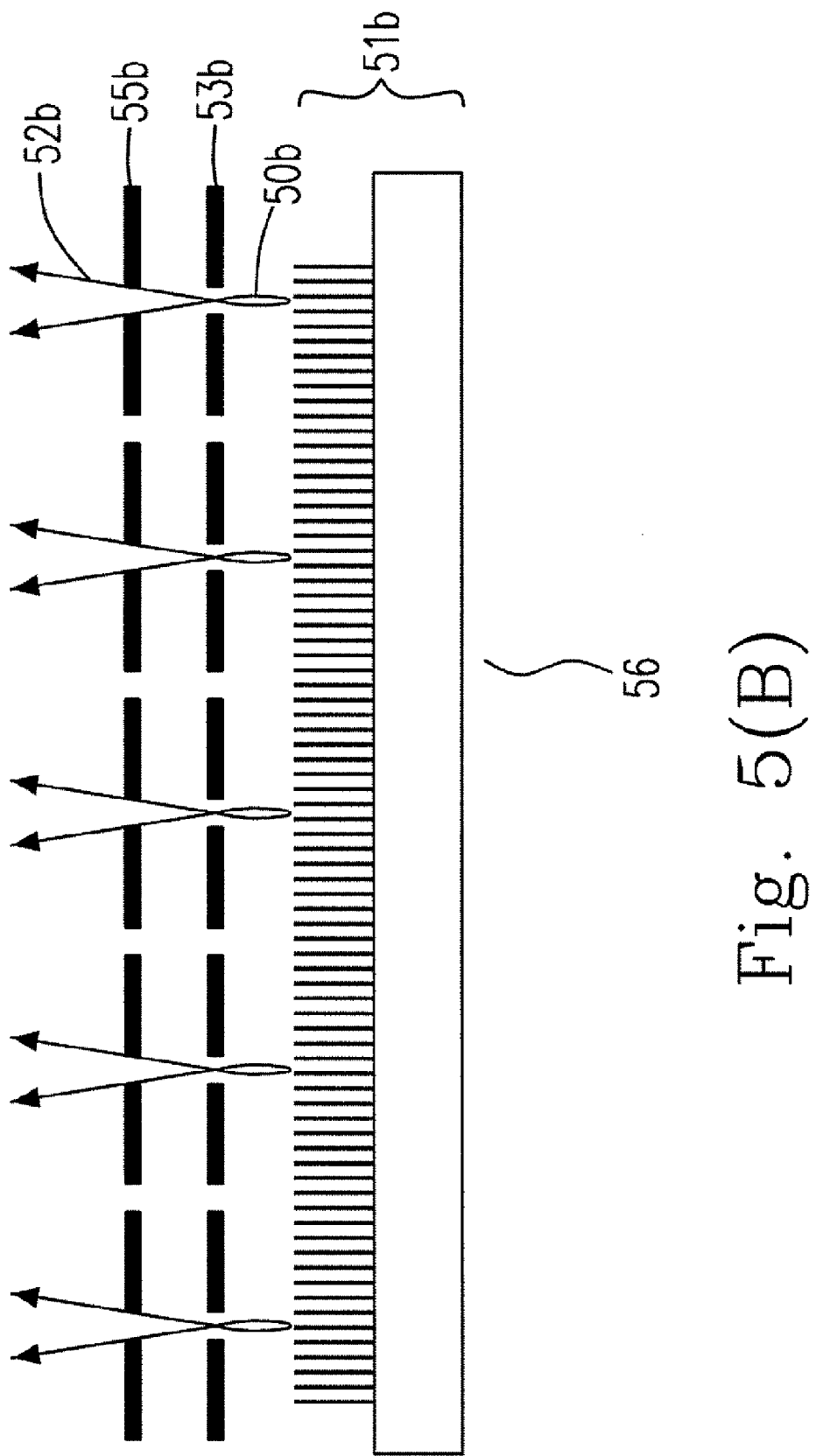
FIG. 5(B) is a diagram schematically illustrating the fabrication apparatus for producing a nano-structure with a two-dimensional patterned electron beam generated by an array of carbon-nanotube in accordance with a preferred embodiment of the present invention.

With reference to FIG. 5(B), the fabrication apparatus for producing a nano-structure with a two-dimensional patterned electron beam generated by an array of carbon-nanotube in accordance with a preferred embodiment of the present invention is schematically illustrated. The fabrication apparatus 5b is constructed by an array of carbon-nanotube 51b and an electrode set of grid 53b and extractor 55b, where the electron beam 50b generated by the array of carbon-nanotube 51b is distributed as the desired two-dimensional patterned electron beam 52b for the nano-structure to be produced through the electrode set of grid 53b and extractor 55b.

Figure 6:
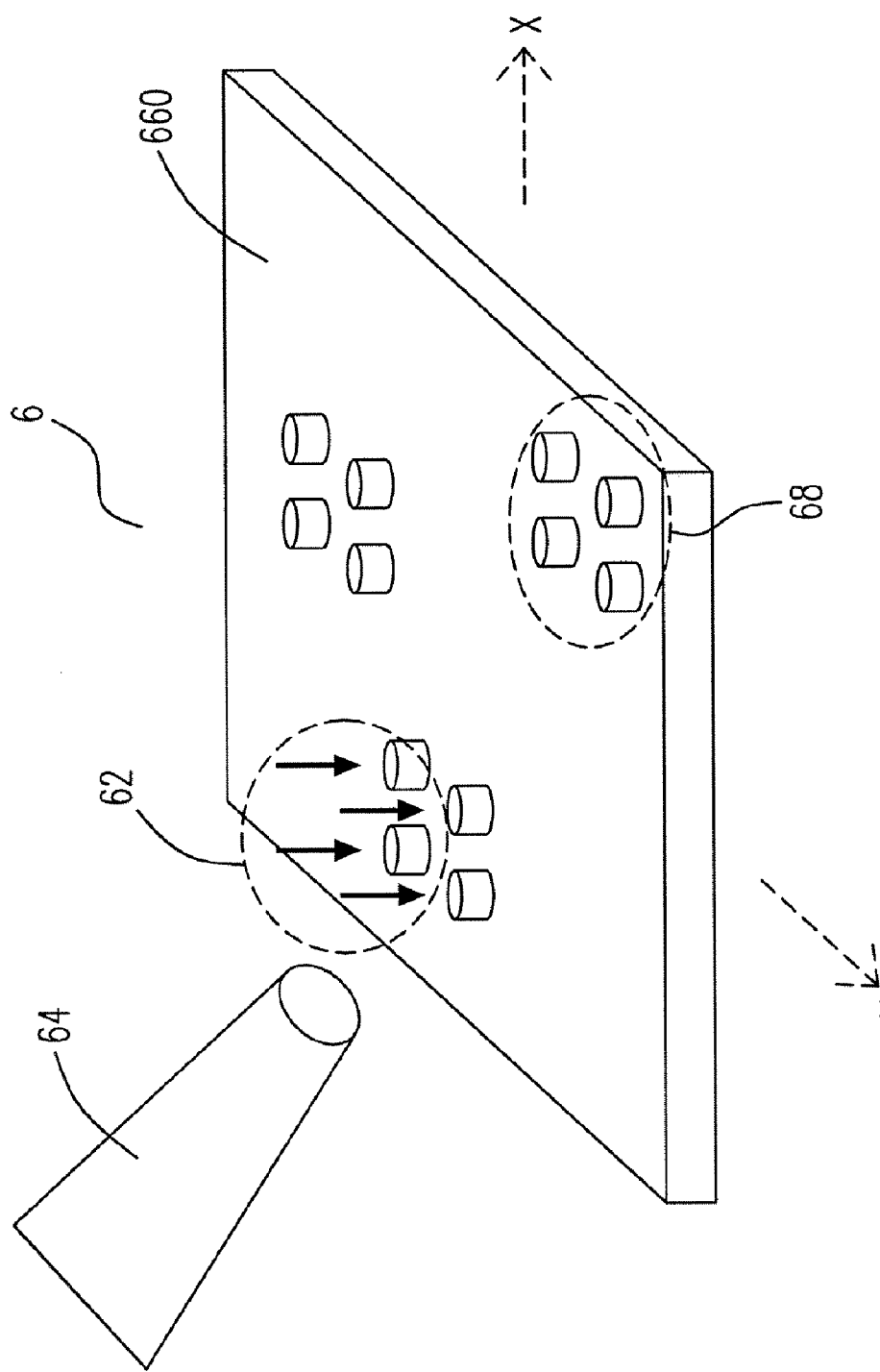
FIG. 6 is a schematic diagram showing the fabrication of the patterned nano-structure according to the present invention.

Please refer to FIG. 6, which is a schematic diagram showing the fabrication of the patterned nano-structure by the apparatus 6 according to the present invention. After the two-dimensional patterned particle beam 62 is generated by any of the mentioned embodiments, the two-dimensional patterned particle beam 62 is provided with the desired pattern for the nano-structure to be produced. The two-dimensional patterned particle beam 62 is properly condensed and focused onto the surface of a substrate 660 through the electromagnetic lens. The precursor gas provided by the precursor gas source 64 may decompose with the aid of the two-dimensional patterned particle beam 62, or may react therewith, and is further deposited on the substrate 660, so that the desired two-dimensional nano-structure 68 is produced thereon. In a preferred embodiment, the substrate 660 is movable, for example by controlling the movement direction of the holder, in the x-direction and y-direction, so that the nano-structure 68 could be produced on a specifically desired position on the substrate 660.

It is achievable to directly produce and deposit a tow-dimensional nano-structure on a substrate with the patterned particle beam of the present invention. In comparison with the conventional techniques, the present invention is advantageous in the reduced time period necessary for the accurate formation of two-dimensional nano-structure and the flexibility in fabricating different kinds of nano-structures, such as nano-dots, lines, arrays or the like. In addition, with the cooperation of an accurate control for the holder, e.g. the scanning panel, the substrate carried thereon is movable in a plane, and thereby the exposure position of the substrate could be optionally selected so as to produce the nano-structure on an accurately desired position. According to the present invention, it is achievable to fabricate the nano-structure of a wide area with an increased rate, and is also achievable to fabricate various nano-structures since the present invention is applicable for different kinds of ion sources. Therefore, the present invention not only has the novelty and the progressiveness, but also has an industry utility.

While the invention has been described in terms of what is presently considered to be the most practical and preferred embodiment, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A fabrication method for a nano-structure with a patterned particle beam, comprising:
   providing a particle beam;
   providing plural guiding wires having a sleeve covering with a lengthwise direction parallel to the plural guiding wires, wherein vacancies are formed among said plural guiding wires;
   patterning said particle beam by causing said particle beam to pass through said plural vacancies among said plural guiding wires to form a two-dimensional patterned particle beam;
   exposing a substrate under said two-dimensional patterned particle beam; and
   providing a precursor gas to react with said two-dimensional patterned particle beam, whereby said nano-structure is formed on said substrate.

2. The fabrication method as claimed in claim 1, wherein said particle beam is selected from a group consisting of a photon beam, an electron beam, an ion beam and the combination thereof.

3. The fabrication method as claimed in claim 1, wherein said particle beam comprises a photo beam generated from one selected from a group consisting of a laser, a mercury lamp, an ultraviolet light source and a combination thereof.

4. The fabrication method as claimed in claim 1, wherein said particle beam comprises a photo beam divided into two beams for forming said two-dimensional patterned particle beam by means of one of interference and diffraction.

5. The fabrication method as claimed in claim 1, wherein said particle beam comprises an electron beam generated from one selected from a group consisting of a field emission source, a thermal emission source, a thermal field emission source, an electron cyclotron, a photocathode, a cesium target and a combination thereof.

6. The fabrication method as claimed in claim 5, wherein said two-dimensional patterned particle beam is formed by said electron beam passing through one of a mask and a reticle.

7. The fabrication method as claimed in claim 1, wherein said particle beam comprises an ion beam generated from one selected from a group consisting of a plasma, a liquid metal ion source and a gas field ion source.

8. The fabrication method as claimed in claim 7, wherein said two-dimensional patterned particle beam is formed by said ion beam passing through one of a mask and a reticle.

9. The fabrication method as claimed in claim 1, wherein said precursor gas absorbs an energy provided by said two-dimensional patterned particle beam and is decomposed to produce said nano-structure on said substrate.

10. A fabrication apparatus for producing a patterned particle beam, comprising:
    a particle source providing a particle beam; and
    a patterning device including plural wires having thereamong plural vacancies, and configured for patterning said particle beam by causing said particle beam to pass through said vacancies so as to generate said patterned particle beam, further comprising a sleeve covering said structure of plural wires, wherein said structure of plural wires has a lengthwise direction parallel to that of said sleeve.

11. The fabrication apparatus as claimed in claim 10, wherein said particle source is one selected from a group consisting of a laser, a field emission source, a thermal emission source, a thermal field emission source, a plasma, a liquid metal ion source and a gas field ion source.

12. The fabrication apparatus as claimed in claim 10, wherein said plural wires are made of tungsten.

13. The fabrication apparatus as claimed in claim 10, wherein said sleeve is made of one selected from a group consisting of tantalum, molybdenum and tungsten.

14. The fabrication apparatus as claimed in claim 10, wherein said patterning device is an optical fiber.

15. The fabrication apparatus as claimed in claim 10, wherein said plural wires and said sleeve are made of an oxide.

16. The fabrication apparatus as claimed in claim 15, wherein said oxide is a silicon oxide.

17. The fabrication apparatus as claimed in claim 10, wherein said patterning device is made by means of lithography and etching.

18. A fabrication apparatus for producing a patterned particle beam, comprising:
    a particle source providing a particle beam; and
    a patterning device comprising plural pillar-shaped structures and a pattern cover disposed on a surface above said plural pillar-shaped structures, and having plural vacancies among said plural pillar-shaped structures, wherein said particle beam passes through said pattern cover and said plural vacancies, and thereby said patterned particle beam is produced.

19. The fabrication apparatus as claimed in claim 18, wherein said pillar-shaped structure is made of stainless steel.

20. The fabrication apparatus as claimed in claim 18, wherein said pattern cover is made of nickel alloy.

21. A fabrication apparatus for producing a nano-structure with a patterned particle beam, comprising:
    a patterned particle source including:
      a particle source providing a particle beam; and
      a patterning device including plural wires having thereamong plural vacancies, and configured for patterning said particle beam by causing said particle beam to pass through said vacancies so as to generate the patterned particle beam, the plural wires further comprise a sleeve covering said plural wires having a lengthwise direction parallel to that of said sleeve; a gas source providing a precursor gas; and
    a holder carrying and moving a substrate disposed thereon, wherein said nano-structure is formed on said substrate by said patterned particle beam reacting with said precursor gas.

22. The fabrication apparatus as claimed in claim 21, wherein said particle source is one selected from a group consisting of a laser, a mercury lamp, an ultraviolet light source, a field emission source, a thermal emission source, a thermal field emission source, a plasma, a liquid metal ion source and a gas field ion source.

* * * * *